(12) United States Patent
Chen et al.

(10) Patent No.: US 6,618,848 B2
(45) Date of Patent: Sep. 9, 2003

(54) METHOD FOR DESIGNING CIRCUIT LAYOUT OF NON-NEIGHBORING METAL BIT LINES TO REDUCE COUPLING EFFECT

(75) Inventors: Han-Sung Chen, Hsin-Chu (TW);
Kuo-Yu Liao, Pan-Chiao (TW);
Yung-Feng Lin, Hsin-Chu (TW);
Chun-Hsiung Hung, Hsin-Chu (TW);
Ho-Chun Liou, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/814,409

(22) Filed: Mar. 22, 2001

(65) Prior Publication Data

US 2002/0138815 A1 Sep. 26, 2002

(51) Int. Cl.[7] ............................................. G06F 17/50
(52) U.S. Cl. ............................................. 716/10; 716/5
(58) Field of Search .............. 716/1, 5, 10; 365/430.06, 365/430.08, 200, 489.05, 230.03, 230.05

(56) References Cited

U.S. PATENT DOCUMENTS 5,818,786 A * 10/1998 Yoneda ................. 365/189.05
6,353,569 B1 * 3/2002 Mizuno et al. ............. 365/210

* cited by examiner

Primary Examiner—Tuan T. Lam
Assistant Examiner—Linh Nguyen
(74) Attorney, Agent, or Firm—Dickinson Wright PLLC

(57) ABSTRACT

A method for designing a circuit layout of non-neighboring metal bit lines to reduce coupling effect in sensing operation is disclosed. The method comprises providing a memory array having a plurality of bit lines arranged sequentially, wherein every two adjacent bit lines are paired in the sensing operation of a memory cell in the memory array. The first embodiment is presented by assigning a first pair of the bit lines permuted with each other to create a non-neighboring bit line layout. The second embodiment is presented by inserting one of a second pair of the bit lines into a first pair of bit lines to separate the first pair of bit lines in layout design. The method further comprises shrinking the layout space between two adjacent non-paired bit lines. In this way, the method contributes to the reduction of metal bit line coupling effect without any trade off of integrated circuit density by modifying the circuit layout of metal bit lines to a non-neighboring bit line arrangement in a memory array.

15 Claims, 5 Drawing Sheets

METHOD FOR DESIGNING CIRCUIT LAYOUT OF NON-NEIGHBORING METAL BIT LINES TO REDUCE COUPLING EFFECT

BACKGROUND OF THE INVENTION

1. Field of the Invention

The present invention generally relates to a method for designing a circuit layout of memory devices, and more particularly to a method for designing a circuit layout of non-neighboring metal bit lines to reduce coupling effect.

2. Description of the Prior Art

A memory device for storing data has a great significance in a data processing system. Memory devices are largely grouped into volatile memory devices, such as random access memories (RAM), whose information is destroyed when power is interrupted and non-volatile memory devices, such as read-only memories (ROM), whose information is retained despite the interruption of power. Particularly, memory devices for non-volatile storage of information are currently in widespread use today, being used in a myriad of applications. These devices provide an indication of the data which is stored therein by providing an output electric signal. A device called a sense amplifier is used for detecting the signal and for determining the logical content thereof.

In general, sense amplifiers determine the logical value stored in a cell by comparing the output of the cell with a reference signal. If the output is above the reference signal, the cell is determined to be erased (with a logical value of 1), and if the output is below the reference signal, the cell is determined to be programmed (with a logical value of 0). The reference signal level is typically set as a voltage level between the expected erased and programmed voltage levels which is sufficiently far from both expected voltage levels so that noise on the output will not cause false results.

Memory devices such as read-only memories ordinarily comprise an array of memory cells. Each column in the array is connected to a bit line (BL), and each row in the array is connected to a word line (WL). Data is read by placing electric signals on the appropriate word lines and bit lines via address decoders. In a read procedure, one of the two selected bit lines is defined as a source and the other is defined as a drain from which the content of the cell will be read. The read-out operation is a process of comparing amounts of currents flowing through a reference cell and a memory cell by using a sense amplifier after making currents flow through the reference cell and a selected memory cell and outputting data output from the sense amplifier to a data buffer.

However, as the density of integration gets higher and higher, the distance between adjacent bit lines has become closer and closer. The distance between two adjacent metal bit lines is too close when cell size continuously shrinks, thus creating cross talk problems. That is to say, coupling which occurs due to capacitance between adjacent bit lines is becoming more and more significant and non-negligible. Accordingly, the portion of the relevant data signal (programmed or erased) within the overall detected signal is significantly small. The detected signal is usually less than 100 mV, but the variation of the signal caused by the bit line coupling is within the range of several 10s mV. To reduce the coupling between adjacent bit lines, whether by extending the distance between adjacent bit lines, which also enlarges the required space of layout in the integrated circuit), or by staggering the operation time of adjacent bit lines, which prolongs the operation time, is a trade off. Hence, the recurring task in memory design is to take steps during layout of the memory to reduce metal bit line coupling.

Referring to FIG. 1, the conventional memory array 100 has a multiplicity of cells 110 which are organized into columns and rows. The memory array 100 contains "m" rows of cells 110, wherein the variable "i" represents the i'th row. The "i" and "m" variables will also be used in conjunction with "WL" to designate the word lines connecting to the gates of the i'th and m'th rows of cells 110, respectively. The memory array 100 also contains "n" columns of cells 110, wherein the variable "j" represents the j'th column. The "j" and "n" variables are also used in conjunction with "BL" to designate the bit lines connecting the drains/sources of the j'th and n'th column of cells 110, respectively. Using these designations, a particular cell in the memory array is designated as C(row, column), wherein C(i, j) is the cell in the i'th row and the j'th column. Two adjacent bit lines BLj and BLj+1 are used during the read-out operation of cell, C(i, j). That is to say, the cell layout is well corresponding to the circuit layout of metal bit lines in the design of the conventional memory array. In the sensing operation of the conventional memory array, two adjacent bit lines are usually used, and the coupling effect induced by the closeness of two adjacent bit lines becomes a problem in the operation.

SUMMARY OF THE INVENTION

In accordance with the present invention, a method is provided for designing a circuit layout of non-neighboring metal bit lines to reduce coupling effect in sensing operation. The present invention takes steps, during layout of the memory device, to design a non-neighboring bit line layout. The non-neighboring bit line layout reduces bit line coupling effect that substantially prevents from false results due to bit line coupling in the read-out operation of a memory device without any trade off of integrated density and time prolongation.

It is another object of this invention that bit line coupling effect is reduced or eliminated by designing a circuit layout of non-neighboring metal bit lines.

It is a further object of this invention that bit line coupling effect is reduced without increasing the circuit layout space.

A method for designing a circuit layout of non-neighboring bit lines to reduce coupling effect in sensing operation is disclosed. The method reassigns the sequence of metal bit lines in layout design corresponding to the logical sequence of metal bit lines by separating adjacent bit lines used in the sensing operation of the memory array. In one embodiment, the method comprises a step of providing a memory array having a plurality of bit lines arranged sequentially, wherein every two adjacent bit lines are paired using in sensing operation of a memory cell in the memory array. Then, a first pair of bit lines is permuted with each other in layout design, whereby the bit lines adjacent to the permuted pair of bit lines are not arranged sequentially in layout. Thus, coupling effect is reduced by the non-neighboring bit line layout of the memory array in sensing operation. The method further comprises assigning a second pair of the bit lines permuted with each other. The coupling effect which is induced by the permuted pair of bit lines can be reduced by extending the layout space between the permuted pair of bit lines or, in other word, by shrinking the layout space between two adjacent non-paired bit lines.

In another embodiment, a method for designing a circuit layout of non-neighboring bit lines to reduce coupling effect in a sensing operation is provided. The method comprising a step of providing a memory array having a plurality of bit lines arranged sequentially, wherein every two adjacent bit lines are paired in the sensing operation of a memory cell in the memory array. Then, in a layout design, a first pair of bit lines is separated by inserting one of a second pair of the bit lines into the first pair of bite lines. Thus, the coupling effect is reduced by separating logical adjacent bit lines in the non-neighboring bit line layout of the memory array in the sensing operation. The method further comprises the step of shrinking the layout space between the separated first pair of bit lines. That is to say, the layout space between two adjacent non-paired bit lines is reduced. The method further comprises inserting one of a third pair of bit lines into the separated first pair of bit lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

A method for designing a circuit layout of non-neighboring bit lines to reduce coupling effect in sensing operation is disclosed. The method reassigns the sequence of metal bit lines in layout design corresponding to the logical sequence of metal bit lines to separate adjacent bit lines used in the sensing operation of the memory array. In the first embodiment, referring to FIG. 2A and FIG. 2B, which are schematic illustrations of a portion of the memory array 200, the method comprises providing a memory array 200 having a plurality of word lines and a plurality of bit lines wherein the bit lines are arranged sequentially. The memory array 200 has a multiplicity of cells which are organized into columns and rows. The memory array 200 contains "m" rows of cells, wherein the variable "i" represents the i'th row. The "i" and "m" variable will also be used in conjunction with "WL" to designate the word lines connecting to the gates of the i'th and m'th rows of cells, respectively. The memory array 200 also contains "n" columns of cells, wherein the variable "j" represents the j'th column. The "j" and "n" variables are also used in conjunction with "BL" to designate the bit lines connecting the drains/sources of the j'th and n'th column of cells, respectively. Using these designations, a particular cell in the memory array is designated as C(row, column), wherein C(i, j) 210 is the cell in the i'th row and the j'th column. Two adjacent bit lines BLj and BLj+1 are used during the read-out operation of cell C(i, j) 210. That is to say, in the memory array 200, every two adjacent bit lines are paired using in sensing operation of a memory cell in the memory array 200.

Figure 1:
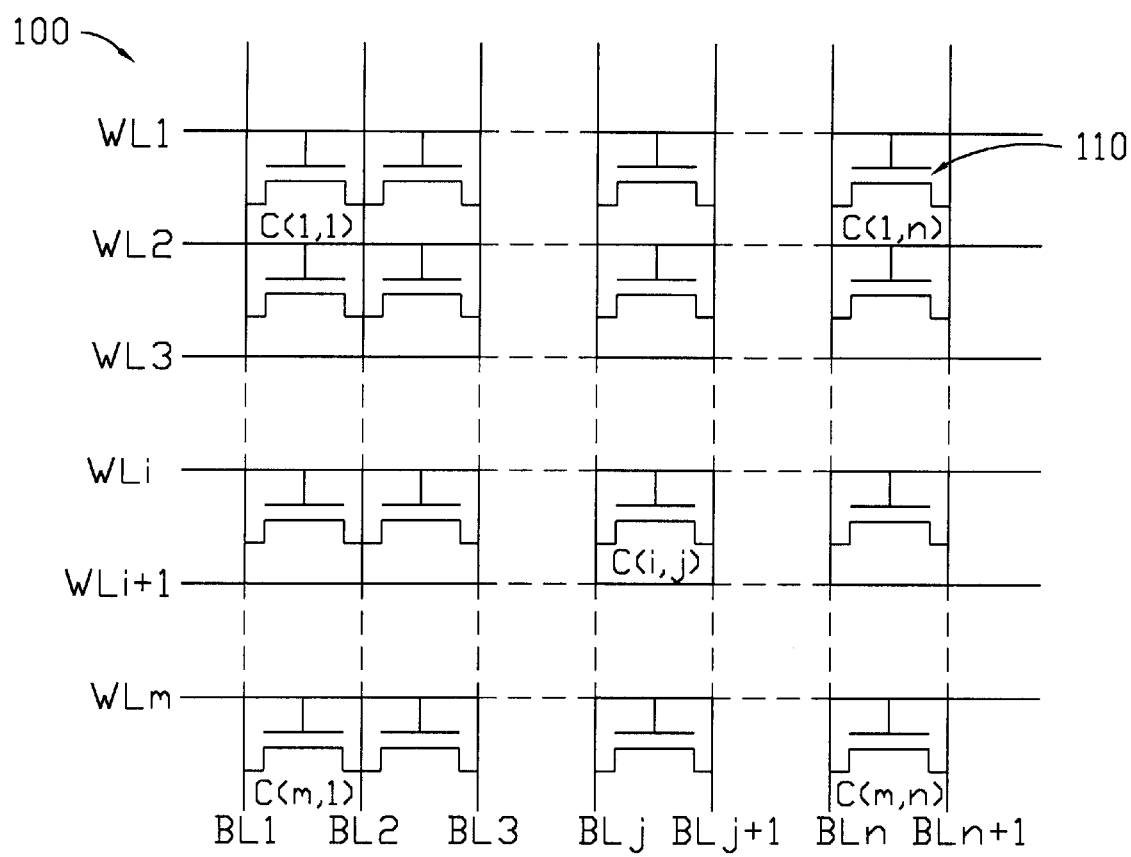
FIG. 1 is a schematic representation of conventional memory array, wherein the layout of cells is well corresponding to the circuit layout of metal bit lines.
Figure 2A:
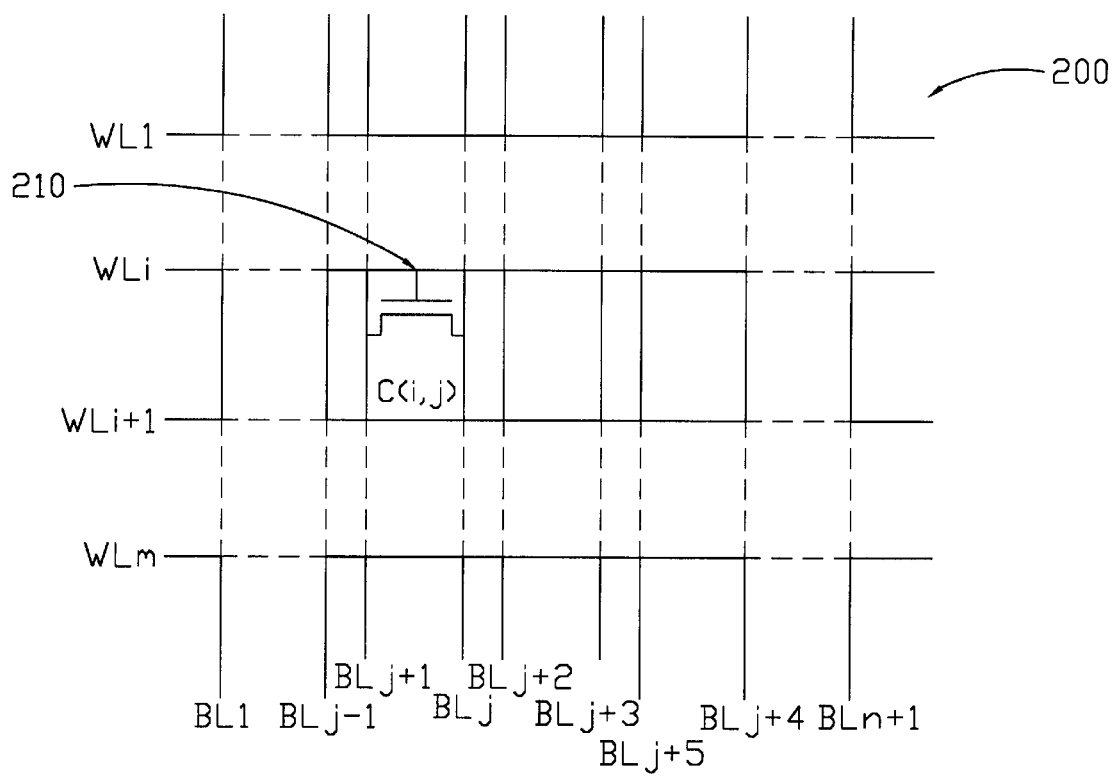
FIG. 2A is a schematic representation of the present invention after permuting the first pair of bit lines in the first embodiment of present invention.
Figure 2B:
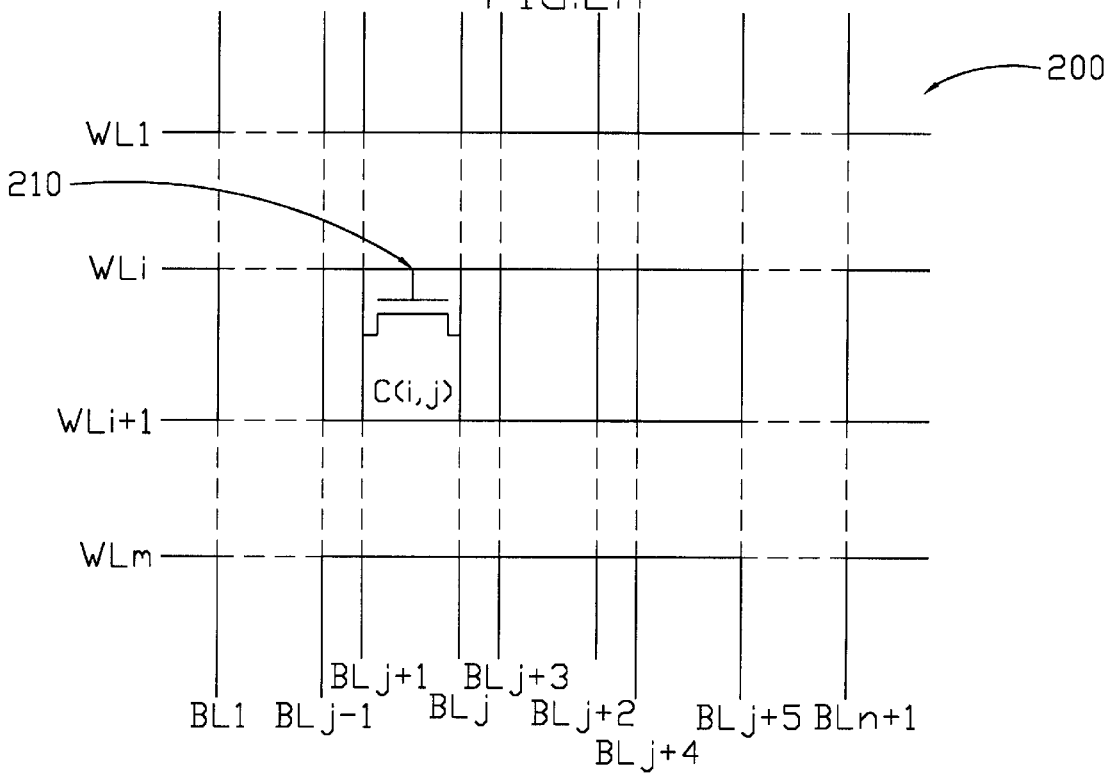
FIG. 2B is a schematic representation of the present invention after permuting the second pair of bit lines in the first embodiment of present invention.

Then, a first pair of bit lines is permuted with each other in layout design, whereby the bit lines adjacent to the permuted pair of bit lines are not assigned sequentially in layout. In sensing operation of the cell C(i, j) 210, the pair of bit lines, BLj and BLj+1, are used. Bit lines adjacent to BLj and BLj+1 are BLj−1 and Blj+2. That is to say, the four bit lines are in a successive sequence, BLj−1, BLj, BLj+1, and BLj+2, in the conventional layout. According to the present invention, the first pair of bit lines, BLj and BLj+1, is permuted with each other, as shown in FIG. 2A. Thus, bit lines, BLj−1, BLj, BLj+1, and BLj+2 are not assigned sequentially anymore, but in the sequence of BLj−1, BLj+1, BLj, and BLj+2. The coupling effect is reduced by designing a circuit layout of non-neighboring bit lines; BLj−1 and BLj; and BLj+1 and BLj+2 in sensing operation of cells, C(i, j−1) and C(i, j+1). Furthermore, the method further comprises assigning a second pair of bit lines permuted with each other. The arrangement of these bit lines can be BLj−1, BLj+1, BLj, BLj+2, BLj+3, BLj+5, and BLj+4. And the arrangement can also be BLj−1, BLj+1, BLj, BLj+3, BLj+2, BLj+4 and BLj+5, as shown in FIG. 2A and FIG. 2B, respectively. The coupling effect which is induced by adjacent bit lines of permuted pair can be reduced by extending the layout space between the permuted pair of bit lines or, in other word, by shortening the layout space between two adjacent non-paired bit lines.

Figure 3A:
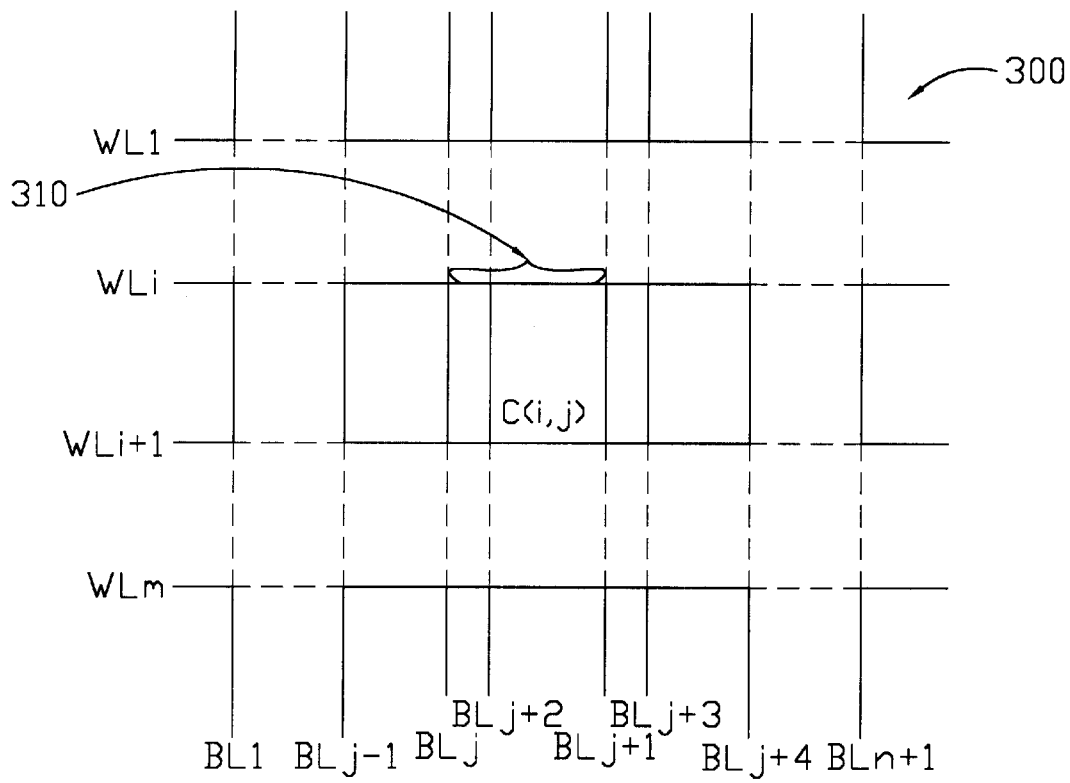
FIGS. 3A and 3B are schematic representations of the present invention after separating the first pair of bit lines in the second embodiment of present invention.
Figure 3B:
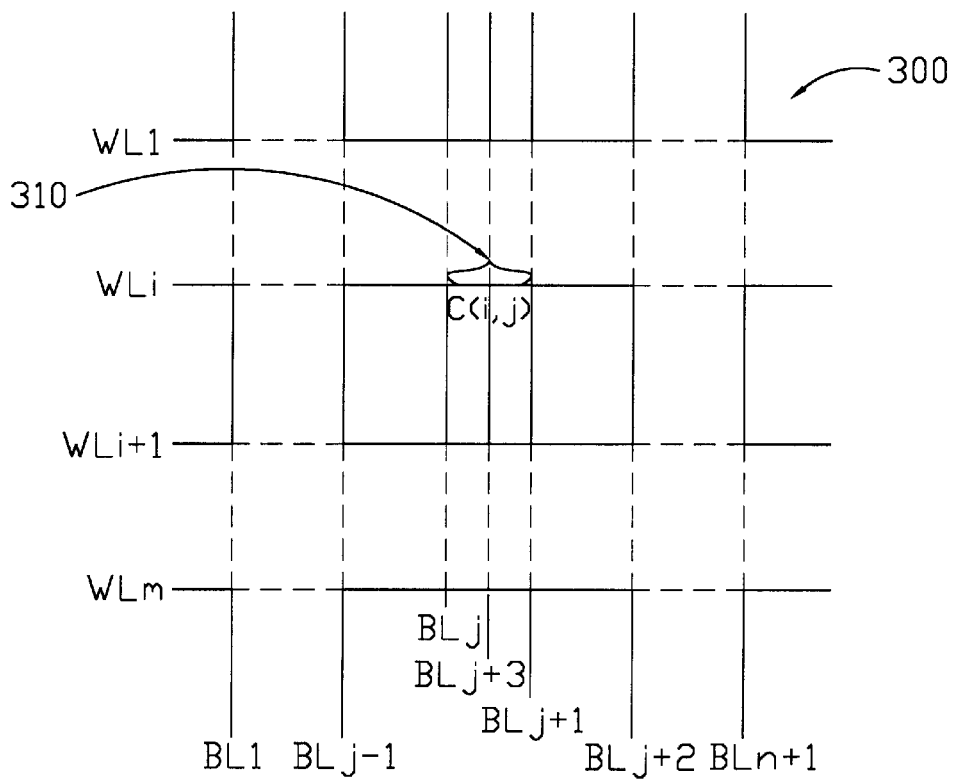
Figure 3C:
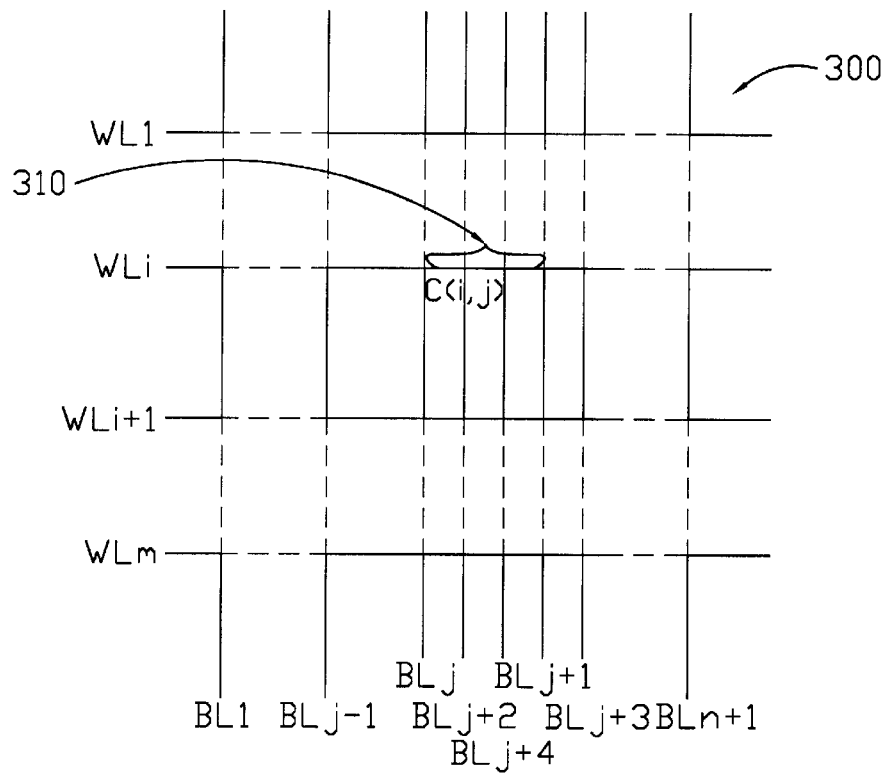
FIG. 3C is a schematic representation of the present invention after inserting one of the third pair of bit lines into the separated first pair of bit lines in the second embodiment of present invention.
Figure 3D:
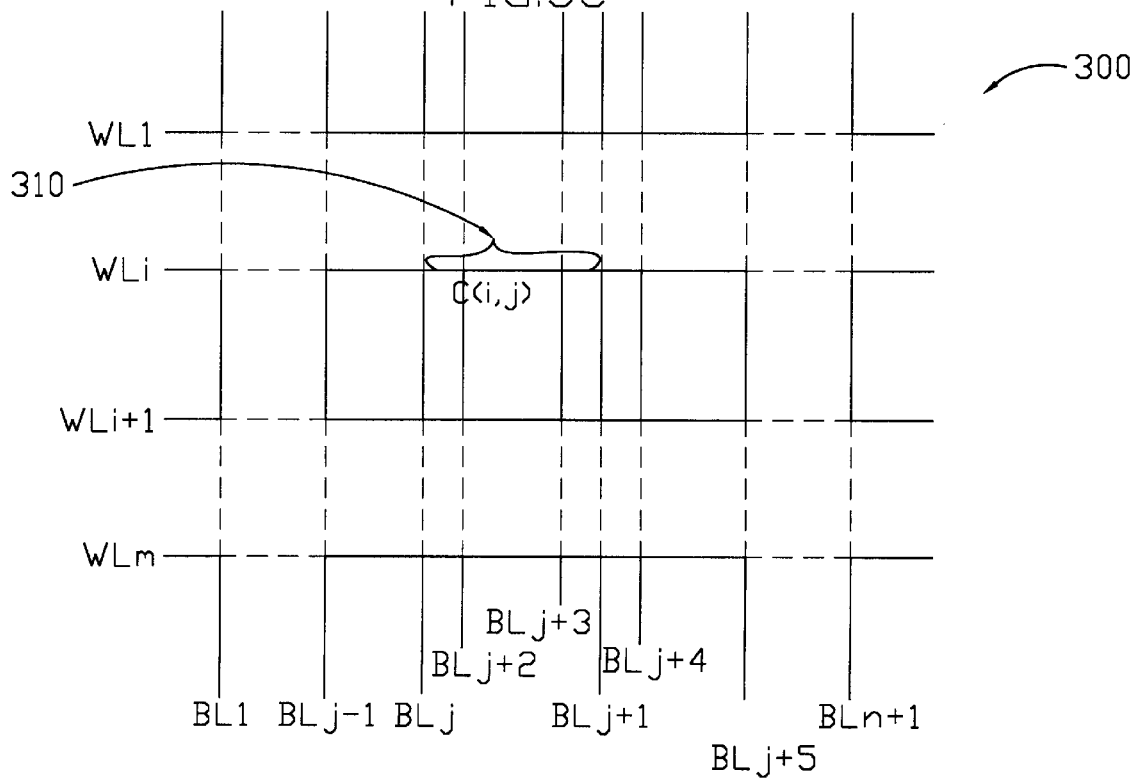
FIGS. 3D and 3E are schematic representations of the present invention after inserting the second pair of bit lines into the first pair of bit lines in the second embodiment of present invention.
Figure 3E:
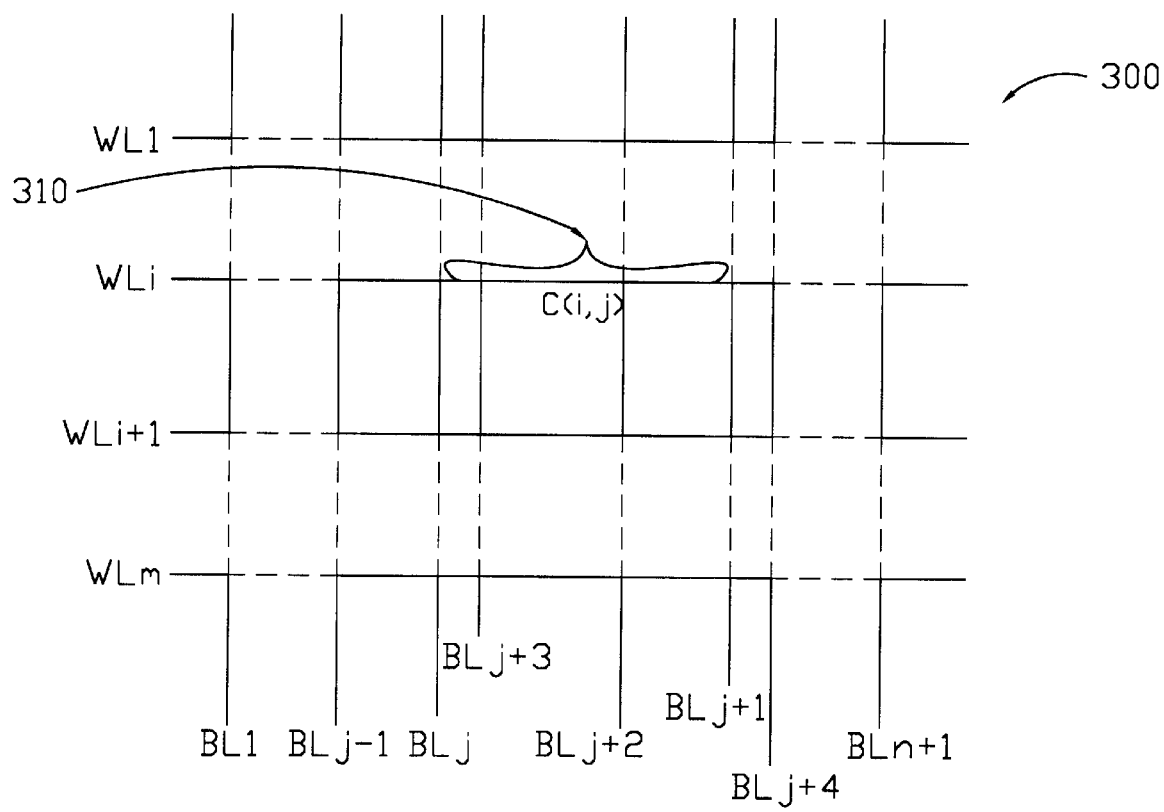

In the second embodiment, a method for designing a circuit layout of non-neighboring bit lines to reduce coupling effect in sensing operation is provided. The method comprises providing a memory array 300 same as that provided in the first embodiment. Then, in layout design, a first pair of bit lines is separated by inserting one of a second pair of the bit lines into the first pair of bit lines. In sensing operation of the cell, C(i, j) 310, the pair of bit lines, BLj and BLj+1, are used. Bit line BLj+2 of the second pair of bit lines, BLj+2 and BLj+3, is inserted into the first pair of BLj and BLj+1. Thus, the four bit lines of the first and second pairs are assigned in sequence, BLj, BLj+2, BLj+1, and BLj+3, as shown in the FIG. 3A. In the inserting step, bit line BLj+3 of the second pair of bit lines, BLj+2 and Blj+3, can also be the one inserted into the first pair of BLj and BLj+1. Thus, the four bit lines of the first and second pairs are assigned in sequence, BLj, BLj+3, BLj+1, and BLj+2, as shown in the FIG. 3B. After the step of inserting bit Line BLj+2 or BLj+3 into the first pair of bit lines, BLj and Blj+1, the method further comprises inserting one bit line of a third pair of bit lines into the separated first pair of bit lines. For example, inserting BLj+4 of the third pair of bit lines, BLj+4 and BLj+5, into the separated first bit lines, shown in FIG. 3C. Thus, coupling effect is reduced by separating logical adjacent bit lines in the non-neighboring bit line layout of the memory array 300 in sensing operation.

Furthermore, the step of separating the first pair of bit lines by inserting one of the second pair of bit lines further comprises inserting more than one bit line into the separated first pair of bit lines. Referring to 3D and 3E, the second pair of bit lines, BLj+2 and BLj+3, are inserted into the first pair of bit lines, BLj and BLj+1. The four bit lines of the first and second pairs are assigned in sequence BLj, BLj+2, BLj+3, and BLj+1, or in sequence BLj, BLj+3, BLj+2, and BLj+1. The method further comprises shrinking layout space between the separated first pair of bit lines, BLj and BLj+1. In other words, the layout space between two adjacent non-paired bit lines is reduced.

Although specific embodiments have been illustrated and described, it will be obvious to those skilled in the art that various modifications may be made without departing from what is intended to be limited solely by the appended claims.

What is claimed is:

1. A method for designing circuit layout of non-neighboring bit lines to reduce coupling effect in sensing operation, said method comprising:

providing a memory array having a plurality of bit lines arranged sequentially, wherein every two adjacent said bit lines are paired using in sensing operation of a memory cell in said memory array; and assigning a first pair of said bit lines permuted with each other in layout design, whereby said bit lines adjacent to said permuted first pair of bit lines are not assigned sequentially, and coupling effect is reduced by non-neighboring bit line layout of said memory array in sensing operation.

2. The method according to claim 1, further comprising extending layout space between said permuted first pair of bit lines.

3. The method according to claim 1, further comprising assigning a second pair of said bit lines permuted with each other.

4. The method according to claim 3, further comprising extending layout space between said permuted second pair of bit lines.

5. A method for designing circuit layout of non-neighboring bit lines to reduce coupling effect in sensing operation, said method comprising:

providing a memory array having a plurality of bit lines arranged sequentially, wherein every two adjacent said bit lines are paired using in sensing operation of a memory cell in said memory array; and separating a first pair of bit lines by inserting one of a second pair of said bit lines into said first pair of bit lines in layout design, whereby coupling effect is reduced by non-neighboring bit line layout of said memory array in sensing operation.

6. The method according to claim 5, further comprising shrinking layout space between said separated first pair of bit lines.

7. The method according to claim 5, further comprising inserting one of a third pair of bit lines into said separated first pair of bit lines.

8. A method for designing circuit layout of non-neighboring bit lines to reduce coupling effect in sensing operation, said method comprising:

providing a memory array having a plurality of bit lines arranged sequentially, wherein every two adjacent said bit lines are paired using in sensing operation of a memory cell in said memory array;

assigning a first pair of said bit lines permuted with each other in layout design; and extending layout space between said permuted first pair of bit lines, whereby said bit lines adjacent to said permuted first pair of bit lines are not assigned sequentially, and coupling effect is reduced by non-neighboring bit line layout of said memory array in sensing operation.

9. The method according to claim 8, further comprising assigning a second pair of said bit lines permuted with each other.

10. The method according to claim 9, further comprising extending layout space between said permuted second pair of bit lines.

11. A method for designing circuit layout of non-neighboring bit lines to reduce coupling effect in sensing operation, said method comprising:

providing a memory array having a plurality of bit lines arranged sequentially, wherein every two adjacent said bit lines are paired using in sensing operation of a memory cell in said memory array; and separating a first pair of said bit lines by inserting a second pair of said bit lines into said first pair of bit lines in layout design, whereby coupling effect is reduced by non-neighboring bit line layout of said memory array in sensing operation.

12. The method according to claim 11, further comprising shrinking layout space between said separated first pair of bit lines.

13. The method according to claim 11, further comprising extending layout space between said second pair of bit lines.

14. The method according to claim 11, further comprising permuting said second pair of bit lines with each other.

15. A method for reducing coupling effect in a memory array, wherein said memory array has a plurality of bit lines arranged sequentially, wherein every two adjacent said bit lines are paired using in sensing operation of a memory cell in said memory array, said method comprising:

assigning a pair of said bit lines permuted with each other in layout design such that bit line layout of said memory array is non-neighboring, whereby coupling effect is reduced by non-neighboring bit line layout of said memory array in sensing operation.

* * * * *